US005352995A

United States Patent [19]

Mouissie

[11] Patent Number: 5,352,995

[45] Date of Patent: Oct. 4, 1994

[54] MULTIPOLAR JACK FOR ELECTRONIC SIGNAL LINES

[75] Inventor: Bob Mouissie, Ek Berlicum, Netherlands

[73] Assignee: Filtec Filtertechnologie Fuer Die Elektronikindustrie GmbH, Lippstadt, Fed. Rep. of Germany

[21] Appl. No.: 73,093

[22] Filed: Jun. 7, 1993

[30] Foreign Application Priority Data

Jun. 5, 1992 [DE] Fed. Rep. of Germany ... 9207521[U]

[51] Int. Cl.[5] ........................ H01R 13/66; H03H 7/00

[52] U.S. Cl. .................................... 333/181; 333/185; 439/620

[58] Field of Search ................................ 333/181–185, 333/12; 439/188, 607, 620

[56] References Cited

U.S. PATENT DOCUMENTS

| | | | |
|---|---|---|---|
| 4,772,224 | 9/1988 | Talend | 439/620 |
| 4,799,901 | 1/1989 | Pirc | 333/185 X |
| 5,069,641 | 12/1991 | Sakamoto et al. | 439/620 |
| 5,139,442 | 8/1992 | Sakamoto et al. | 439/620 |

*Primary Examiner*—Seungsook Ham

*Attorney, Agent, or Firm*—Herbert L. Lerner; Laurence A. Greenberg

[57] ABSTRACT

A multipolar plug connector assembly includes a plug connector and a plug for a given number of signal lines conducting digitized electronic signals. The plug connector has a housing in the form of a conductive shielding enclosure. At least the given number of contact springs with associated conductors is disposed in the housing. The plug connector cooperates with the plug for making contact and for lifting the contact springs from a position of rest into an operating position, when the plug connector and the plug are plugged together. A filter configuration, in the form of a low-pass filter or band pass filter, is disposed in the plug housing and has contact surfaces. The contact surfaces cooperate with the contact springs and are electrically connected with the conductors, when bringing the contact springs into the operating position by inserting the plug into the plug connector.

11 Claims, 3 Drawing Sheets

Fig.2
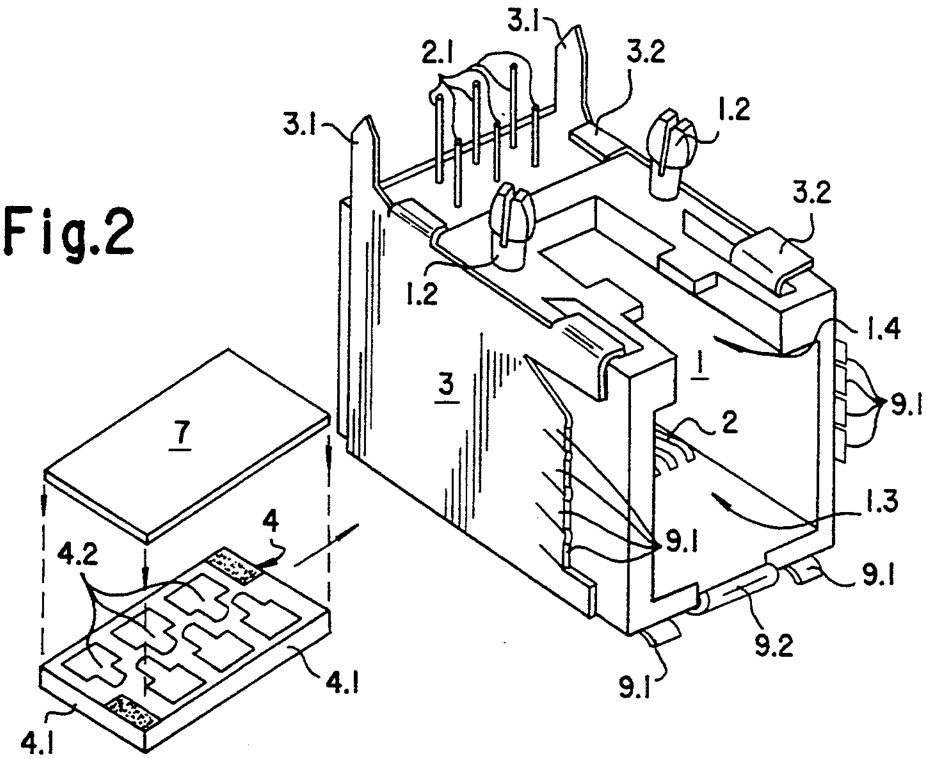
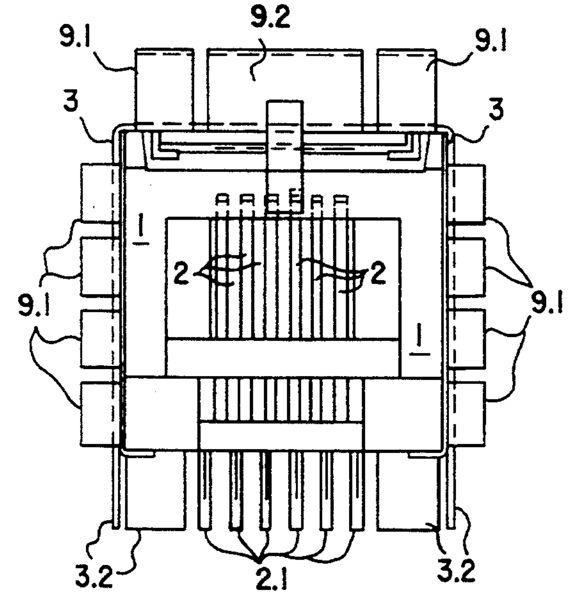
Fig.3
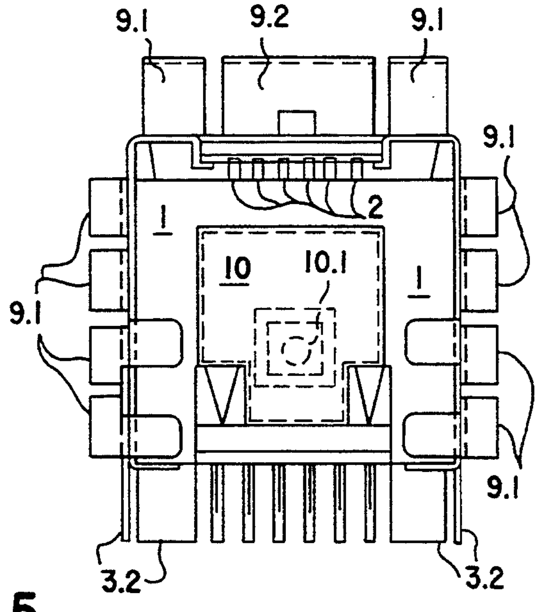
Fig.5

MULTIPOLAR JACK FOR ELECTRONIC SIGNAL LINES

BACKGROUND OF THE INVENTION

Field of the Invention

The invention relates to a multipolar plug connector assembly with a plug and a plug connector or matching plug for signal lines conducting digitized electronic signals, wherein the plug connector has a housing in which a number of contact springs at least corresponding to the number of signal lines is disposed and the plug connector cooperates with the plug in such a way that when they are plugged together, on one hand contact is made and on the other hand the contact springs are lifted from a position of rest into an operating position.

Commercially available jacks, such as are customarily employed in connection with telephones, are provided with a plurality of signal lines. When inserting the plug, which can be placed in the jack in a form-locking manner and locked in, contact strips or contact pins of the plug are brought into contact with the contact springs and the electrical connection is made in that way. A form-locking connection is one which connects two elements together due to the shape of the elements themselves, as opposed to a force-locking connection, which locks the elements together by force external to the elements. In the course of such a connection, the contact springs are elastically deformed to generate the contact pressure required for a low-voltage connection. The contact springs are displaced by that deformation. Such a plug-in connection is sufficient for analog signals, such as are used in a telephone. However, if such a plug connector is to be used for making electric connections in which the signal lines carry digitized signals, interference can occur, which is the result of high-frequency signals picked up by transmission lines. The reason therefor is that "pulse-type" signals are used when transmitting digital signals, which generate harmonic interference signals. It is known from the field of oscillation theory to split such pulses into a sequence of sinusoidal oscillations with upper harmonic waves of rising frequencies (harmonic or Fourier analysis). Particularly high harmonics occur if the pulses have steep slopes. With rise times in the range of 1 ns, harmonics are generated which lie at $f_c=0.35\cdot Tr^{-1}$ and therefore at 350 MHz. In that way signal lines of computers can carry signals having harmonics which lie in the range of Megahertz and even as high as Gigahertz. Such higher harmonics can then result in difficulties because of superposition, particularly if several linked electronic data processing installations generate such pulses in a room so that their higher harmonics can interfere with each other in such a way that the problem-free operation of a computer, for example, becomes questionable. Filters are required to keep such superpositions within limits by weakening the unwanted higher harmonics without changing the data signal in an undesirable manner. A capacitor is a circuit element suited for achieving that goal, because its leakage resistance is reversely proportional to the frequency. It goes without saying that such filter connectors are intended to offer protection in particular against interference pulses coming from the exterior, such as electro-magnetic pulses EMP or transmission of radio frequency pulses RFI.

SUMMARY OF THE INVENTION

It is accordingly an object of the invention to provide a multipolar jack for electronic signal lines, which overcomes the hereinafore-mentioned disadvantages of the heretofore-known devices of this general type and which makes such a plug-in connection possible for use in an interface by a simple restructuring of the jack as an interface connection equipped with shielding and filtering for the computer area in particular.

With the foregoing and other objects in view there is provided, in accordance with the invention, a multipolar plug connector assembly, comprising a plug connector and a plug for a given number of signal lines conducting digitized electronic signals; the plug connector having a housing in the form of a conductive shielding enclosure; at least the given number of contact springs with associated conductors being disposed in the housing; the plug connector cooperating with the plug for making contact and for lifting the contact springs from a position of rest into an operating position, when the plug connector and the plug are plugged together; and a filter configuration, in the form of a low-pass or band pass filter, being disposed in the plug housing and having contact surfaces, the contact surfaces cooperating with the contact springs and being electrically connected with the conductors, when bringing the contact springs into the operating position by inserting the plug into the plug connector.

In accordance with another feature of the invention, the housing has a depression formed therein for receiving the planar filter. Through the use of this construction, a shielded jack provided with an input filter is obtained which permits input filtering of the signals in the individual signal lines, in cooperation with the matched plug. It goes without saying that such a shielding enclosure is electrically connected with a grounded one of the signal lines or with a cable containing the shielding of these signal lines.

In an advantageous manner, a commercially available jack is used for this purpose which is known as a "modular plug connection" or "Western plug connection", in which case the jack is completed by means of the installed planar filter. Such a filter is formed of a substrate as a support for the filter, over the entire surface of which an electrode, generally the ground electrode, is printed and connected through its edge zones with the shielding. In that case the connections of the capacitors of the planar filter are formed by contact surfaces which are centrally applied to the substrate and connected with the conductors of the connector. However, that configuration limits the peak voltage which the capacitor configuration is capable of sustaining, and exceeding that peak value results in the destruction of the filter. However, that disadvantage, which would per se require elaborate peak voltage limiters needing space, is compensated for since when the plug is inserted into the plug connector, the contact pins of the plug first make contact with the contact springs of the plug connector, which only thereafter come to rest against the contact springs with the contact surfaces of the filter. For this reason there is no danger of a discharge of static charges through the filter capacitors.

In accordance with a further feature of the invention, the plug connector has soldering pins for soldering on a printed circuit board. This plug connector, which can be directly soldered on a printed circuit board, is placed directly on the board and the soldering pins are soldered to the corresponding strip conductors. In this way extremely short internal connecting paths are created which make possible the undistorted transmission even of extremely steep pulse slopes.

In accordance with an added feature of the invention, the depression for receiving the planar filter is provided on the side facing away from the connecting side having the soldering pins with support bars being bent at right angles at least on two sides located opposite each other, for receiving the planar filter. Through the use of such a depression it is possible to insert the planar filter approximately flush into the shielding enclosure, wherein the penetrating backplate electrode of the capacitors assumes the role of shielding. It goes without saying that it is also possible to mount the planar filter at right angles with the printed circuit board, in which case the depression can be omitted.

In accordance with an additional feature of the invention, the planar filter inserted into the depression is affixed by means of a preferably resilient insert having at least one tongue which cooperates in a form-locking manner with the shielding enclosure. In addition to their fastening function, these bars that are bent at right angles and the resilient tongues provide the contact with the backplate electrode for the capacitors. The required contact pressure is assured in this case by the construction of the bars being bent at right angles, into which the planar filter can be inserted with a good press fit. With resilient contact tongues being provided, the seat of the planar filter in the bars that are bent at right angles can be kept more loosely, because in this case the contact tongue(s) resting against the contact edge(s) provide(s) the electrical connection between the shielding enclosure and the backplate electrode of the capacitors.

In accordance with a concomitant feature of the invention, the side of the planar filter facing the contact springs is covered with a layer of an elastomer, which is constructed as a foil being electrically conductive exclusively selectively normal to its surface. Through the use of this foil insert an elastic buffer member is inserted which is capable of compensating for electric contact springs that are inaccurately sized relative to the contact surfaces of the planar filter. Such selectively conducting foils are known. They are manufactured by filling a block of electrically conducting carbon fibers that are aligned in parallel and tensed, with an elastomer, in particular with silicon rubber, and cutting this block into slices at right angles to the direction of the carbon fibers after hardening of the elastomer. Due to the selective conductivity at right angles to the plane of the foil, only the contact surface corresponding to one contact spring is in electrical connection with it and short circuits are avoided in this way.

In accordance with the invention, the jack of a known and commercially available plug connector, for example, is improved in such a way that a shielded plug connector provided with a filter is created without considerable additional cost, wherein the inserted filters are only activated when the plug is inserted into the jack and, when the plug is not inserted, only the shielding is active. In this way the filters remain without charge as long as no line has been connected to them. Thus it becomes possible to also use commercially available and therefore inexpensive plug connectors even for interfaces in computers.

Other features which are considered as characteristic for the invention are set forth in the appended claims.

Although the invention is illustrated and described herein as embodied in a multipolar jack for electronic signal lines, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2 is a diagrammatic, perspective view of a plug connector inserted into a shielding enclosure, as well as a filter unit that is shown prior to insertion and is turned through 180°, that is upside down as compared to FIG. 1;

FIG. 3 is a front-elevational view of a plug connector that is not equipped with a plug but in which the filter unit is inserted;

FIG. 5 is a front-elevational view of a plug connector equipped with a plug and with the filter unit inserted.

DESCRIPTION OF THE PREFERRED EMBODIMENT

Figure 1:
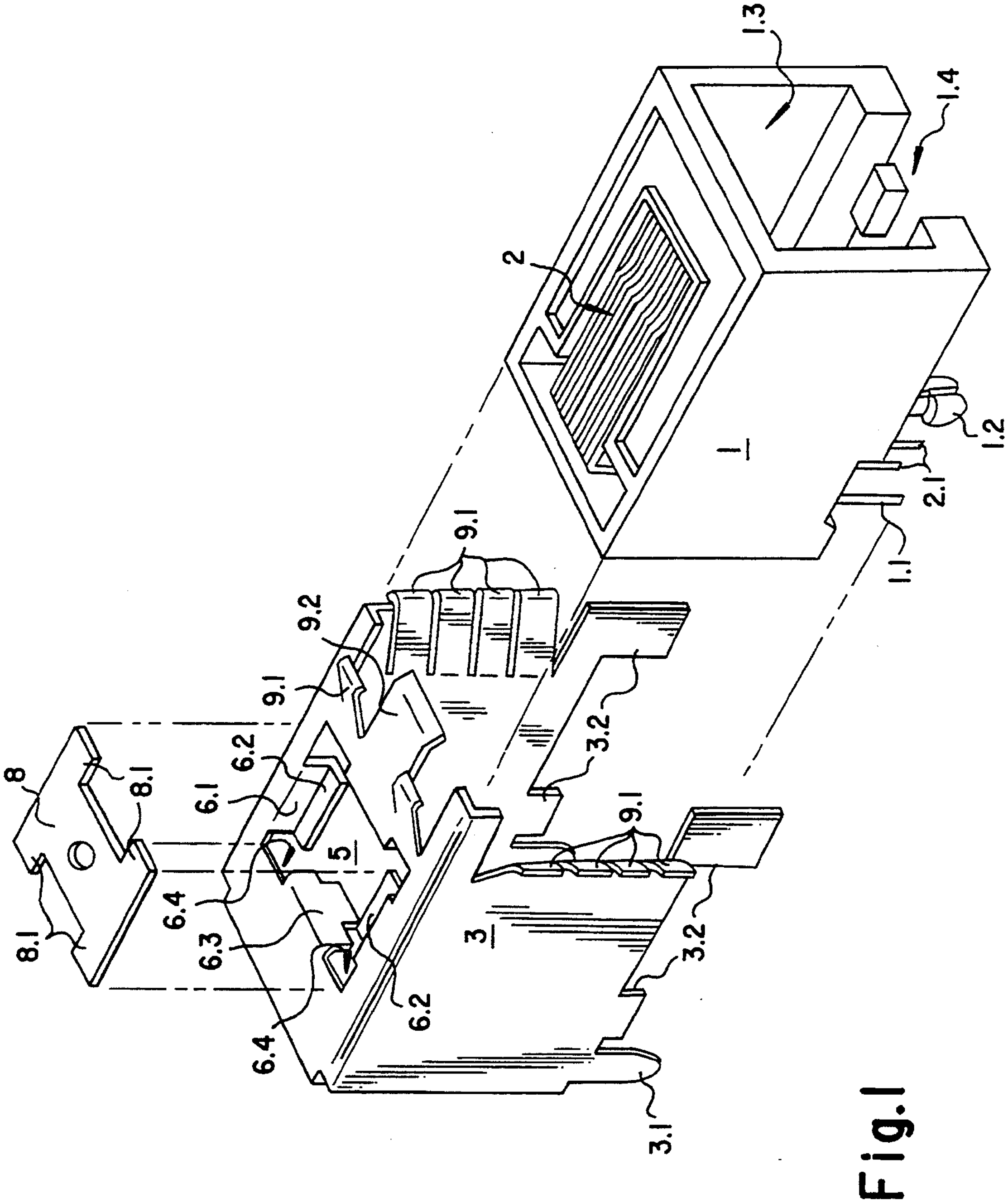
FIG. 1 is an exploded, diagrammatic, perspective view of a plug connector and a shielding enclosure.
Figure 6:
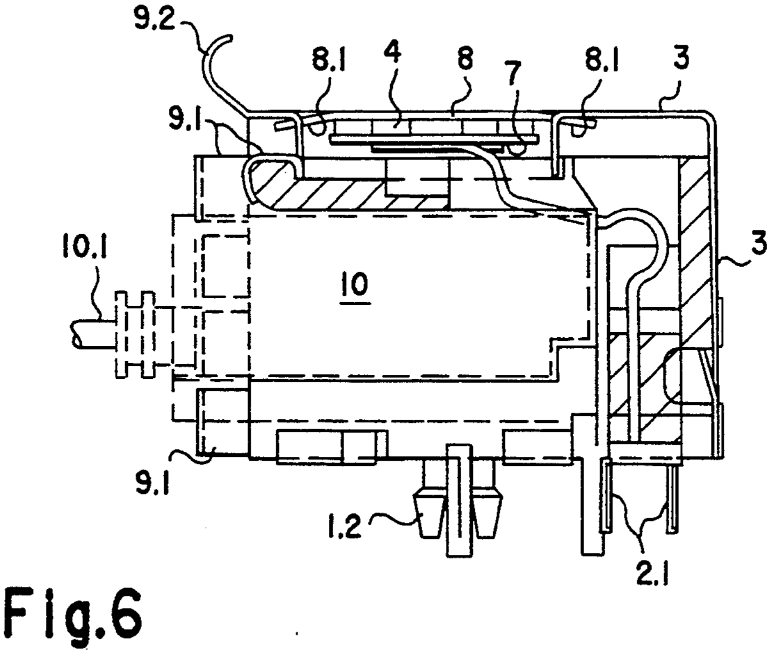
FIG. 6 is a sectional view of a plug connector equipped with a plug in accordance with FIG. 5.

Referring now in detail to the figures of the drawing, in which a standard plug connector assembly or jack is shown in a preferred embodiment with a shielding cap and an inserted filter element and first, particularly, to FIGS. 1 and 2 thereof, there is seen a commercially available plug connector or matching plug 1 with spring contacts 2, into which a plug 10 shown in FIG. 6 can be inserted through a front opening 1.3. The front opening 1.3 is provided with guide grooves 1.4 cooperating with corresponding bars and/or stop springs of the plug 10. In this case, FIG. 1 shows the commercially available plug connection with the shielding enclosure, while in FIG. 2 the plug connector 1 provided with the shielding cap 3 is shown from the side of soldering pins 2.1. In other words, the bottom in FIG. 1 is at the top in FIG. 2. The plug connector 1 is formed of a housing that is open on at least one side, which is the open side with the opening 1.3 permitting the insertion of the plug 10 shown in FIGS. 5 and 6. The additional grooves or recesses 1.4 form-lockingly cooperate with protrusions on the plug 10. In actual practice, additional stop means for securing the plug 10 in the plug connector 1 are provided. This plug connector 1 is inserted into the shielding cap 3 and fixed therein by bending over lateral and upper tongues 9.1. The shielding is continued into the area of the inserted plug 10 by means of an upper tongue 9.2 and lateral assembly tongues 3.2. The plug connector 1 provided with the shielding cap 3 is seated on a non-illustrated circuit board and is fixed on it by means of tabs 1.1 and 1.2 formed from the plug connector 1 and tabs 3.1 which bend around and are formed from the shielding cap 3. Ends of the spring contacts 2 form soldering pins 2.1, by means of which the plug connector is inserted into a printed circuit board and is connected with strip conductors. In this way contact is made with lines coming in through the plug 10 on the circuit board and the fixation of the plug connector 1 on the circuit board is also aided.

A filter element or configuration 4 that is used essentially contains capacitors which intercept voltage peaks arriving through the input lines and in this way protect a connected device. Each one of these capacitors has an electrode which can be connected with one of the lines coming in through the plug 10 and backplate electrodes corresponding to these electrodes, which can be connected to ground. Each of the electrodes is connected with one contact location 4.2, while the backplate electrodes are in conducting connection with a metallized edge 4.1 of the filter unit through a common connection. The metallized contact locations 4.2 are brought out on the side of the filter element 4 facing the spring contacts 2 and form contact islands there which, after insertion of the plug 10, are conductingly connected with the associated conductors of the spring contacts 2. This contact side of the filter element 4 is suitably covered with an elastic foil 7, which is only conductive in a direction normal to its surface, but is insulating in a direction transverse thereto. Such a selectively conducting foil is produced, for example, by cutting a silicon rubber block penetrated by parallel carbon fibers into "slices" at right angles to the direction of the carbon fibers. The thickness of these slices is sufficient to overcome tolerances in the size of the spring contacts 2 of the plug connector 1 and to absorb the pressure of these spring contacts 2, which are lifted during the insertion of the plug 10, so that deformations are prevented together with the not yet inserted filter element 4 which has been laterally displaced with the selectively conducting cover 4.1. The filter element 4 and the cover 4.1 are shown vertically separated for greater clarity.

The filter element 4 itself is inserted into the opening 5 on the top of the shielding cap 3. In this case this opening 5 is shaped in such a way that lateral bars 6.1 and 6.3 remain, which are bent at right angles in relation to the top of the shielding cap 3. The lateral bars 6.1 have parts 6.2 which are again bent, on which the filter unit 4 is seated and through which the ground contact to the backplate electrode of the filter unit 4 is made. The inserted filter unit 4 is fixed in the installation position by means of an insertion plate 8. This insertion plate 8 has extending tongues 8.1 which engage recesses 6.4 of the shielding cap 3. The insertion plate 8 is advantageously made from a spring plate and is provided with pre-stressing in such a way that the filter unit 4 is under the influence of the mechanical tension of this insertion plate 8 and is thus securely maintained and tensed, so that a pressure which is advantageous for assured contacting is exerted on the filter element 4. Beyond this, the insertion plate 8 provides secure shielding, because the extending tongues 8.1 have assured ground contact at the sharp edges of the recesses 6.4 receiving these tongues. One skilled in the art can discern that the planar filter 4 need not necessarily be provided parallel to the printed circuit board, but can also be in another position, for example at right angles in relation to the printed circuit board, depending on the construction of the plug connector.

Figure 4:
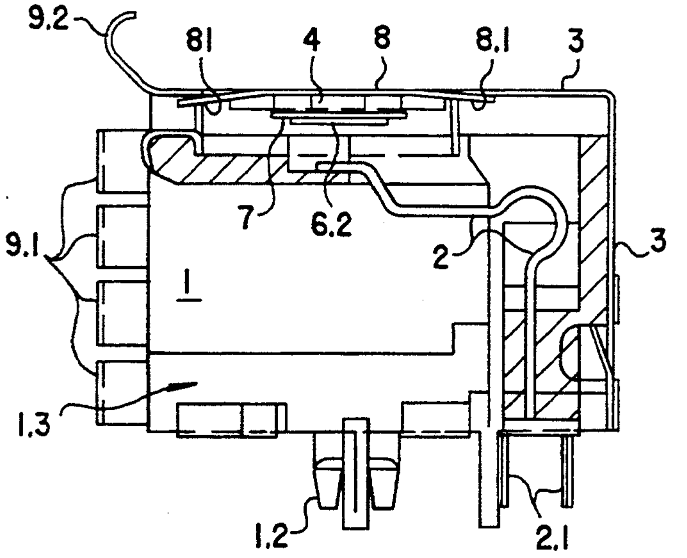
FIG. 4 is a sectional view of a plug connector that is not equipped with a plug in accordance with FIG. 3.

FIGS. 3 and 4 show the plug connector 1 in the shielding cap 3 with the filter unit 4 resting on the support bars 6.2 and being covered by the selectively conducting foil 7. In the illustration of FIG. 3, the plug has not been inserted, on one hand to provide a view of the open side in FIG. 3 which permits the insertion of the plug 10, and on the other hand to show a diagrammatic section through the plug connector 1 with the attached shielding cap 3. The views are based on FIGS. 1 and 2, and attention is invited to the reference numerals therein. In this case, the contact springs 2 are in the position of rest, and their ends do not touch the contact surfaces 4.2 of the capacitors of the filter unit 4 or the selectively conducting foil 7, which are seen in FIG. 2.

In contrast thereto, in the illustrations of FIGS. 5 and 6, the plug 10 has been inserted into the plug connector 1, as is shown by dashed lines, and one end of the plug 10 is connected with a cable 10.1. The plug 10 is pushed underneath the contact springs 2 with its front end which has contact tracks corresponding to the contact springs 2, in such a way that they come into electrically conducting contact with the contact tracks of the plug 10, and in this way provide the continuous electrically conducting connections for the lines entering through the plug 10. In the course of this insertion, the contact springs 2 are bent upward and their ends rest against the selectively conducting foil 7. The foil 7 is pushed in at the points of contact by the force of the springs, which increases the contact area. Through the use of this feature, on one hand the assurance of making contact through the selectively conducting foil 7 is increased, and on the other hand the pressure is reduced at a given force, because the contact area is increased due to "dents" in the foil. Deformation of the contact springs 2 is effectively prevented because of this reduction in pressure. In addition, the foil permits a certain compensation for tolerances because of production techniques or for a reduction of the spring force due to use. The contact springs 2, which are lifted by the inserted plug 10, rest with their soldering pins or free ends 2.1 against the metallized edges or contact surfaces 4.1 of the capacitors of the filter element 4 and in this way provide the contact necessary for switching on the capacitors of the filter element 4. Based on this switching taking place when the plug is inserted, the filter element 4 is active only when the plug has been inserted. If the plug is not inserted, the filter element 4 is switched off, so that pulses or charges then occurring cannot damage the capacitors of the filter element 4.

I claim:

1. A multipolar plug connector assembly, comprising:

a plug connector and a plug for a given number of signal lines conducting digitized electronic signals;

said plug connector having a housing in the form of a conductive shielding enclosure;

a plurality of contact springs being at least equal in number with said given number of signal lines, said contact springs having associated conductors and being disposed in said housing;

said plug connector cooperating with said plug for making contact with the contact springs of said plug and for lifting said contact springs from a position of rest into an operating position, when said plug connector and said plug are plugged together; and a filter configuration being disposed in said plug housing and having contact surfaces, said contact surfaces cooperating with said contact springs, and said conductors being physically disconnected from said contact surfaces when unplugged and physically and electrically connected with said conductors when plugged, by bringing said contact springs from the position of rest into the operating position when said plug is inserted into said plug connector.

2. The plug connector according to claim 1, wherein said filter configuration is a low-pass filter.

3. The plug connector according to claim 1, wherein said filter configuration is a band pass filter.

4. The plug connector assembly according to claim 1, wherein said filter configuration is planar, and said housing has a depression formed therein for receiving said planar filter configuration.

5. The plug connector assembly according to claim 1, wherein said plug connector has soldering pins to be soldered to a printed circuit board.

6. The plug connector assembly according to claim 3, wherein said plug connector has a connecting side at which said soldering pins are disposed, said filter configuration is planar, said housing has a side facing away from said connecting side with a depression formed therein for receiving said planar filter configuration, and said housing has support bars bent at right angles at least on two sides disposed opposite each other for receiving said planar filter configuration.

7. The plug connector assembly according to claim 6, including an insert having at least one tongue cooperating with said shielding enclosure for fixing said planar filter configuration in said depression.

8. The plug connector assembly according to claim 7, wherein said insert is resilient.

9. The plug connector assembly according to claim 1, wherein said filter configuration is planar, said planar filter configuration has a side facing said contact springs, and including a layer of an elastomer covering said side of said planar filter facing said contact springs, said elastomer layer being a foil being electrically conductive exclusively normal to its surface.

10. A multipolar plug connector assembly, comprising:

a plug connector and a plug for a given number of signal lines conducting digitized electronic signals;

said plug connector having a housing in the form of a conductive shielding enclosure;

a plurality of contact springs being at least equal in number as said given number of signal lines, said contact springs having associated conductors and being disposed in said housing;

said plug connector cooperating with said plug for making contact and for lifting said contact springs from a position of rest into an operating position, when said plug connector and said plug are plugged together; and a filter configuration being disposed in said plug housing and having contact surfaces, said contact surfaces cooperating with said contact springs and being electrically connected with said conductors, when bringing said contact springs into the operating position by inserting said plug into said plug connector;

wherein said plug connector has a connecting side at which said soldering pins are disposed, said filter configuration is planar, said housing has a side facing away from said connecting side with a depression formed therein for receiving said planar filter configuration, and said housing has support bars bent at right angles at least on two sides disposed opposite each other for receiving said planar filter configuration.

11. A multipolar plug connector assembly, comprising:

a plug connector and a plug for a given number of signal lines conducting digitized electronic signals;

said plug connector having a housing in the form of a conductive shielding enclosure;

a plurality of contact springs being at least equal in number as said given number of signal lines, said contact springs having associated conductors and being disposed in said housing;

said plug connector cooperating with said plug for making contact and for lifting said contact springs from a position of rest into an operating position, when said plug connector and said plug are plugged together;

a planar filter configuration disposed in said plug housing and having contact surfaces, said contact surfaces cooperating with said contact springs and being electrically connected with said conductors, when bringing said contact springs into the operating position by inserting said plug into said plug connector, said planar filter configuration having a side facing said contact springs; and a layer of an elastomer covering said side of said planar filter facing said contact springs, said elastomer layer being a foil being electrically conductive exclusively normal to its surface.

* * * * *